United States Patent
Kim et al.

(10) Patent No.: US 7,348,831 B2
(45) Date of Patent: Mar. 25, 2008

(54) CURRENT MIRROR CIRCUIT, DRIVING CIRCUIT USING THE SAME, AND METHOD OF DRIVING THE CIRCUIT

(75) Inventors: Yang Wan Kim, Seoul (KR); Oh Kyong Kwon, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 9 days.

(21) Appl. No.: 11/281,683

(22) Filed: Nov. 18, 2005

(65) Prior Publication Data

US 2006/0132196 A1 Jun. 22, 2006

(30) Foreign Application Priority Data

Nov. 22, 2004 (KR) ...................... 10-2004-0095982
Nov. 23, 2004 (KR) ...................... 10-2004-0096377

(51) Int. Cl.
*G05F 1/10* (2006.01)
(52) U.S. Cl. ..................................... 327/538
(58) Field of Classification Search ................ 323/315, 323/316, 317; 327/538, 543
See application file for complete search history.

(56) References Cited

U.S. PATENT DOCUMENTS 6,768,348 B2 * 7/2004 Shionoiri et al. ............ 327/51
6,806,762 B2 * 10/2004 Stair et al. .................. 327/538

FOREIGN PATENT DOCUMENTS

| JP | 2003-122307 | 4/2003 |
| WO | WO 01/02925 A1 | 1/2001 |

* cited by examiner

*Primary Examiner*—Jeffrey Zweizig
(74) *Attorney, Agent, or Firm*—H.C. Park & Associates, PLC

(57) ABSTRACT

A current mirror circuit is disclosed that is capable of supplying a desired second current regardless of whether the threshold voltages of the current mirror circuit's transistors are the same or different. The current mirror circuit includes a first transistor whose first terminal is electrically connected to a voltage source and whose gate terminal and second terminal are electrically connected to each other. A second transistor has a first terminal electrically connected to the voltage source and a gate terminal electrically connected to the gate terminal of the first transistor. A compensator that compensates for different threshold voltages of each of the first transistor and the second transistor is also included. Because differences in the threshold voltages of the transistors connected to the current mirror are compensated for, embodiments of the invention are able to generate a desired second current that can be used to power a driver or similar device. Additionally, the invention's current mirror circuit may function as a bias unit so that a driving circuit can be stably driven.

16 Claims, 5 Drawing Sheets

US 7,348,831 B2

CURRENT MIRROR CIRCUIT, DRIVING CIRCUIT USING THE SAME, AND METHOD OF DRIVING THE CIRCUIT

CROSS-REFERENCE TO RELATED APPLICATIONS

This application claims priority to and the benefit of Korean Patent Application Nos. 2004-95982, filed on Nov. 22, 2004 and 2004-96377, filed on Nov. 23, 2004, in the Korean Intellectual Property Office, each disclosure of which is incorporated herein by reference in its entirety.

BACKGROUND

1. Field of the Invention

The present invention relates to current mirror circuits generally and to methods of driving such circuits, and more particularly to a current mirror circuit capable of supplying a desired current that corresponds to a first current regardless of the threshold voltages of one or more transistors included in a driving circuit that contains the current mirror circuit. The invention further relates to a method of driving the driving circuit that contains a current mirror circuit constructed in accordance with the principles of the invention.

2. Discussion of Related Art

A current mirror circuit is a circuit in which a value of an output current is determined by a value of an input current. The current mirror circuit is used for various circuits.

FIG. 1 illustrates a conventional current mirror circuit that includes a first transistor M1 and a second transistor M2. Each transistor M1 and M2 includes a first terminal, a second terminal, and a gate terminal.

The first terminal of the transistor M1 is electrically connected to a voltage source VDD. The second terminal and the gate terminal of the transistor M1 are electrically connected to each other. That is, electric current flows through the transistor M1 so that the transistor M1 not only serves as a diode, but also supplies to its second terminal a current I1 that corresponds to the voltage source VDD. The first terminal may be set as one of a source terminal and a drain terminal and the second terminal may be set to be different from the first terminal. For example, when the first terminal is set as the source terminal, the second terminal is set as the drain terminal.

The transistor M2 is electrically connected to the transistor M1 to form a current mirror circuit. Therefore, the gate terminal of the transistor M2 is electrically connected to the gate terminal of the transistor M1, and the first terminal of the transistor M2 is electrically connected to the voltage source VDD. Assuming that a ratio of a channel width and a channel length (W/L) of the transistor M1 approximately equals a ratio of a channel width and a channel length (W/L) of the transistor M2, a current I2 flowing from the transistor M2 is preferably set to equal the current I1 that flows from the transistor M1. That is, the current mirror circuit controls the first current I1 to thereby control the value of the second current I2 that is supplied to one or more external components.

The conventional current mirror circuit may have several applications. For example, the conventional current mirror circuit may be electrically connected to a driver 2 and used as a bias unit 1 as illustrated in FIG. 2. In operation, the bias unit 1, which includes the current mirror circuit of FIG. 1, supplies the second current I2 (that is, bias current) to the driver 2 so that the driver 2 can perform desired operations. In turn, the driver 2 performs a predetermined operation when the second current I2 is supplied. By way of example, the driver 2 may function as either an amplifier or a buffer.

In the conventional current mirror circuit, the difference between a threshold voltage of the transistor M1 and a threshold voltage of the transistor M2 creates a difference in current outputted from each transistor. Therefore, it is not possible to generate a desired current outputted from the transistor M2 that matches the current outputted from the transistor M1. A threshold voltage may be defined as a gate voltage at or below which the transistor remains turned off (and no current flows) and above which the transistor turns on (and current flows).

Otherwise identical transistors M1 and M2 may have different threshold voltages due to deviations caused by manufacturing or other processes. For example, the threshold voltage of the transistor M1 may be set as 0.7V and the threshold voltage of the transistor M2 may be set as 0.3V. In such a case, the first current I1 that flows via the transistor M1 and the second current I2 that flows via the transistor M2 will have different values, each of which corresponds to one of the different threshold voltages. Due to the different threshold voltages, it is not possible to generate a desired second current I2. This is particularly problematic when the current mirror circuit is used for a part sensitive to current such as a pixel of a light emitting display, since any deviation in current generated by the different threshold voltages of the transistors M1 and M2 causes serious problems.

SUMMARY OF THE INVENTION

Accordingly, embodiments of the invention provide an improved current mirror circuit capable of supplying current regardless of the values of one or more particular threshold voltage(s). Embodiments of the invention also provide a driving circuit using the improved current mirror circuit, and a method of driving the driving circuit.

The foregoing and/or other aspects of the present invention are achieved by providing a current mirror circuit that includes a first transistor whose first terminal is electrically connected to a voltage source and whose gate terminal and second terminal are electrically connected to each other. The circuit further includes a second transistor whose first terminal is electrically connected to the voltage source and whose gate terminal is electrically connected to the gate terminal of the first transistor. The circuit also includes a compensator that compensates for the threshold voltages of each of the first and second transistors.

The threshold voltage of the first transistor may be stored in the first capacitor and the threshold voltage of the second transistor may be stored in the second capacitor when the first control signal is supplied.

Another embodiment of the invention provides a driving circuit that includes a bias unit for supplying bias current and a driver coupled with the bias unit and driven when the bias current is supplied. The bias unit includes a first transistor having a first terminal electrically connected to a voltage source and having a gate terminal and a second terminal that are electrically connected to each other. The bias unit may further include a second transistor having a first terminal electrically connected to the voltage source and having a gate terminal electrically connected to the gate terminal of the first transistor. The bias unit may further comprise a compensator for compensating the threshold voltages of each of the first and the second transistor.

Another embodiment of the invention provides a method of driving a current mirror circuit. In one embodiment, the method includes the step of compensating for the threshold voltages of each of the first and second transistors, which are connected to form a current mirror. The method further includes the steps of supplying a first current via the first transistor through which electric current flows so that the first transistor serves as a diode, and supplying a second current via a second transistor such that the value of the second current corresponds to the value of the first current.

BRIEF DESCRIPTION OF THE DRAWINGS

These and/or other aspects and advantages of the invention will become apparent and more readily appreciated from the following description of the preferred embodiments, taken in conjunction with the accompanying drawings.

DETAILED DESCRIPTION OF PREFERRED EMBODIMENTS

Hereinafter, preferable embodiments according to the invention will be described with reference to the accompanying drawings, that is, FIGS. 3, 4, 5, 6, 7, 8, 9, and 10.

Figure 1:
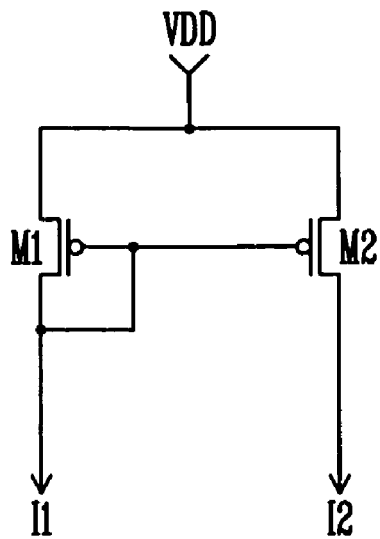
FIG. 1 is a circuit diagram illustrating a conventional current mirror circuit.
Figure 2:
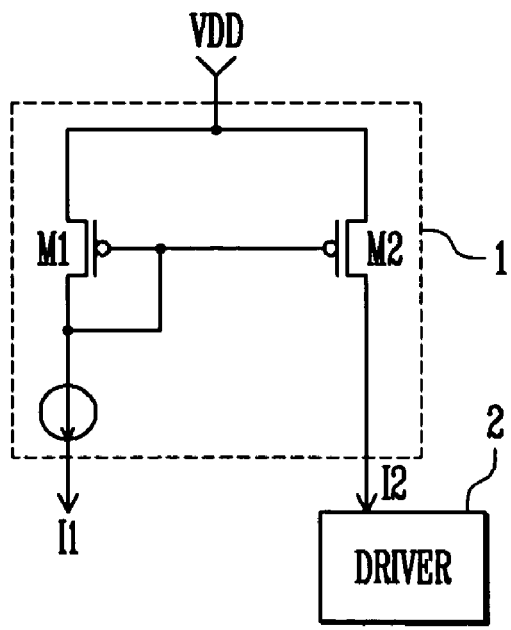
FIG. 2 illustrates a driving circuit using the conventional current mirror circuit.
Figure 3:
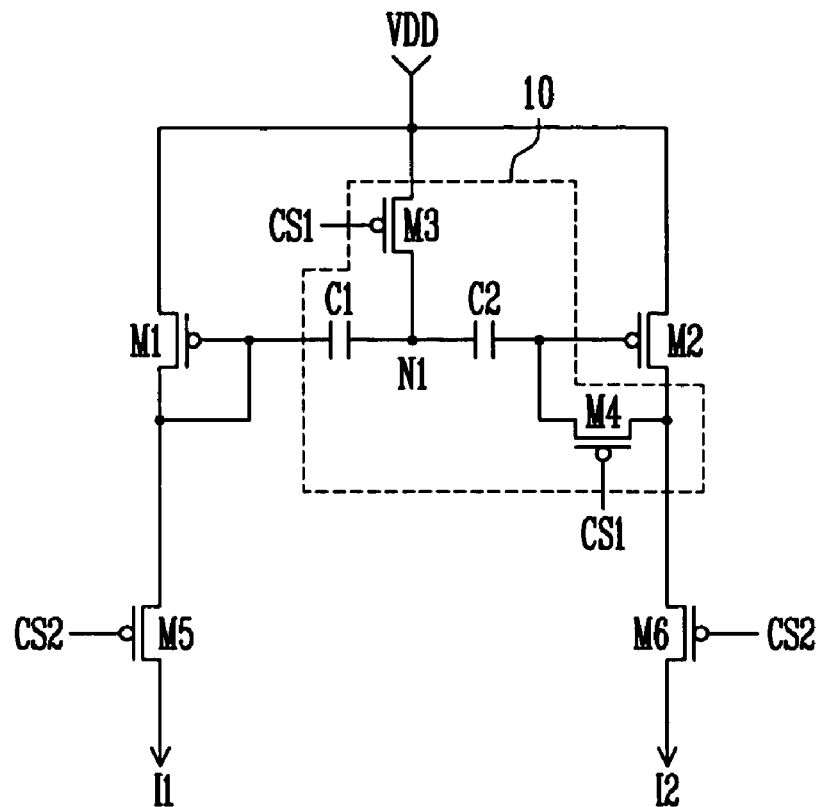
FIG. 3 is a circuit diagram illustrating a current mirror circuit according to an embodiment of the present invention.

Referring to FIG. 3, a current mirror circuit constructed according to one the embodiment of the invention may include transistors M1 and M2 that are electrically connected to each other. The current mirror circuit may also include a compensator 10 for compensating for the threshold voltages of each of the transistors M1 and M2. Each of the transistors M1 and M2 include a first terminal, a second terminal, and a gate terminal.

The first terminal of the first transistor M1 may electrically connect to a voltage source VDD, and the second terminal and the gate terminal of the transistor M1 may electrically connect to each other. In operation, electric current flows through the transistor M1 so that the transistor M1 serves as a diode, thereby causing the transistor M1 to supply a predetermined current to its second terminal.

The current mirror circuit may further be formed by electrically connecting the gate terminal of the transistor M2 to the gate terminal of the transistor M1. Additionally, the first terminal of the transistor M2 may be electrically connected to the voltage source VDD.

In use, the compensator 10 compensates for the (different) threshold voltages of each of the transistors M1 and M2 so that a desired current output via the transistor M2 can be supplied regardless of any deviation in the threshold voltages of each of the transistors M1 and M2. Thus, the compensator 10 includes a third transistor M3, a fourth transistor M4, a first capacitor C1, and a second capacitor C2, which may be arranged and configured as described below.

The capacitor C1, electrically connected between the gate terminal of the transistor M1 and the gate terminal of the transistor M2, stores a voltage that corresponds to the threshold voltage of the transistor M1.

The capacitor C2, electrically connected between the capacitor C1 and the gate terminal of the transistor M2, stores a voltage that corresponds to the threshold voltage of the transistor M2.

The transistor M3, electrically connected between the voltage source VDD and a first node N1 that is a common node of the first and second capacitors C1 and C2 turns on when a first control signal CS1 is supplied. When actuated, the transistor M3 supplies the voltage of the voltage source VDD to the node N1.

The transistor M4, electrically connected between the gate terminal and the second terminal of the transistor M2, turns on when the control signal CS1 is supplied so that electric current flows to the transistor M2 and so that the transistor M2 serves as a diode.

Additionally, the current mirror circuit may also include a fifth transistor M5 connected to the second terminal of the transistor M1 and a sixth transistor M6 connected to the second terminal of the transistor M2.

The transistor M5 supplies current I1 from the transistor M1 to the second terminal of the transistor M5 when a second control signal CS2 is supplied. The transistor M6 supplies current I2 from the transistor M2 to the second terminal of the transistor M6 when the control signal CS2 is supplied. In other words, when the control signal CS2 turns on the fifth and sixth transistors M5 and M6, then a predetermined current I1 flows via the first transistor M1 and a predetermined current I2 flows via the transistor M2. The value of the current I2 may correspond to the value of the current I1.

Figure 4:
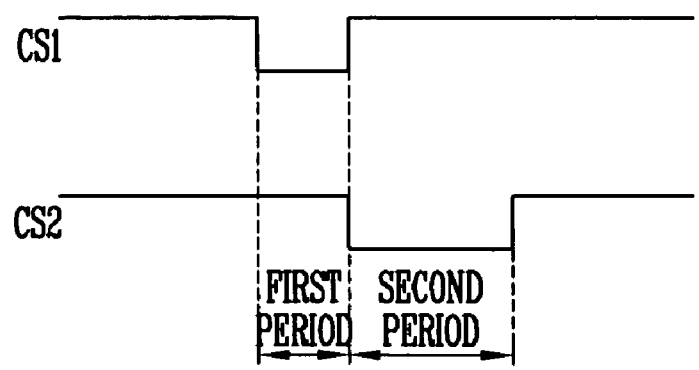
FIG. 4 depicts exemplary waveforms that describe control signals supplied to the current mirror circuit illustrated in FIG. 3.

FIG. 4 illustrates control signals supplied to the current mirror circuit illustrated in FIG. 3. Referring to FIG. 4, the first control signal CS1 and the control signal CS2 are sequentially supplied to the current mirror circuit. Thus, in a first period where the control signal CS1 is supplied, the threshold voltages of each of the transistors M1 and M2 are compensated for. In a second period where the control signal CS2 is supplied, a desired current is supplied via the transistor M6 to one or more external components.

An exemplary operation of a driving circuit of the invention will be described in detail with reference to FIGS. 3 and 4. First, the control signal CS1 may be supplied from a control source that is coupled with the circuit. When the control signal CS1 is supplied, the third and fourth transistors M3 and M4 turn on.

When the transistor M3 turns on, the voltage of the node N1 increases to the voltage of the voltage source VDD. When the transistor M4 turns on, electric current flows through the transistor M2 so that the transistor M2 serves as a diode. Then, the voltage of the gate terminal of the transistor M2 has a value equal to what may be obtained by subtracting the threshold voltage $V_{th}$ of the transistor M2 from the voltage of the voltage source VDD. In this case, the threshold voltage $V_{th}$ of the transistor M2 corresponds to the difference between the voltage of the node N1 and the voltage of the gate terminal of the transistor M2. The threshold voltage $V_{th}$ is stored in the capacitor C2.

Since current flows through the transistor M1 so that the transistor M1 serves as a diode, the voltage of the gate terminal of the transistor M1 has a value equal to what may be obtained by subtracting the threshold voltage $V_{th}$ of the transistor M1 from the voltage $V_{th}$ of the voltage source VDD during the period when the control signal CS1 is supplied. Thus, the threshold voltage $V_{th}$ of the transistor M1 is stored in the capacitor C1. The threshold voltage $V_{th}$ corresponds to the difference between the voltage of the node N1 and the voltage of the gate terminal of the transistor M1.

That is, according to the present invention, the threshold voltage $V_{th}$ of the transistor M1 may be stored in the capacitor C1 and the threshold voltage $V_{th}$ of the transistor M2 may be stored in the capacitor C2 in the period when the control signal CS1 is supplied.

Then, the control signal CS2 is supplied so that the fifth and sixth transistors M5 and M6 turn on. When the transistor M5 turns on, the first current I1 flows from the voltage source VDD via the first and fifth transistors M1 and M5.

When the transistor M6 turns on, the second current I2, which may have a value that corresponds to a value of the first current I1, is supplied to one or more external components. When a ratio of a channel width and a channel length (W/L) of the transistor M1 equals a ratio of a channel width and a channel length (W/L) of the transistor M2, the first current I1 and the second current I2 are set as the same current. That is, according to the invention, it is possible to generate a desired second current I2 whose value corresponds to the value of the first current I1 regardless of the threshold voltages of each of the transistors M1 and M2. That is, according to the invention, since the threshold voltages of each of the transistors M1 and M2 are stored in the first and second capacitors C1 and C2, respectively, during the period when the control signal CS1 is supplied, it is possible to generate a desired current I2 whether or not the value of the threshold voltage of the transistor M1 is the same or different than the value of the threshold voltage of the transistor M2.

Figure 5:
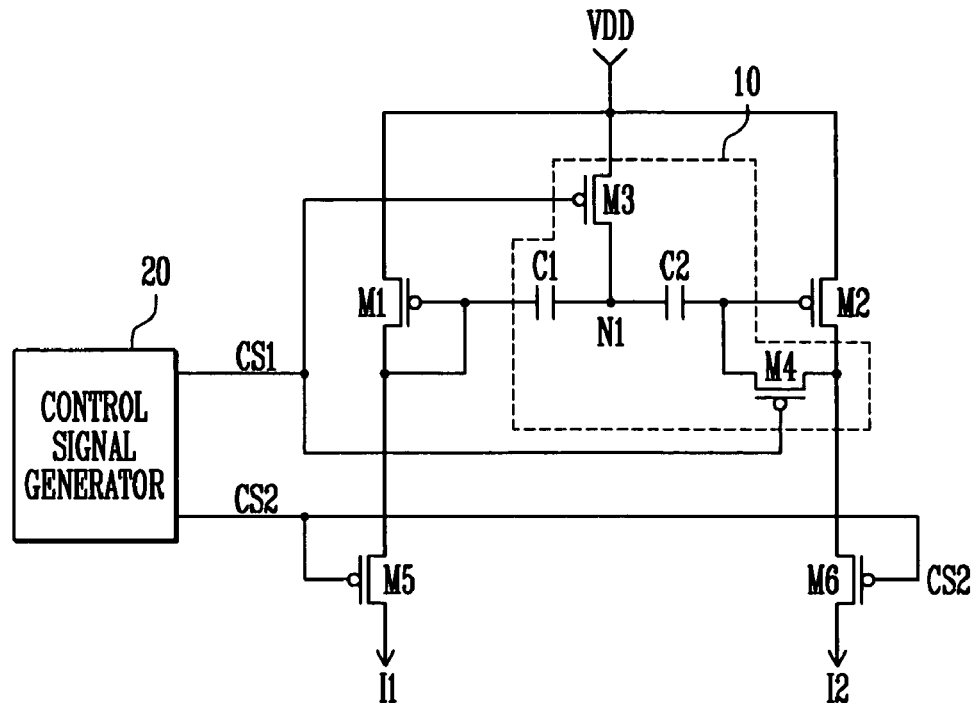
FIG. 5 illustrates that a control signal generator may be added to the current mirror circuit illustrated in FIG. 3.

Additionally, as illustrated in FIG. 5, the current mirror circuit of the invention may further include a control signal generator 20 for generating the first and second control signals CS1 and CS2. The control signal generator 20 may sequentially generate the first control signal CS1 and the second and control signal CS2 that are illustrated in FIG. 4.

Figure 6:
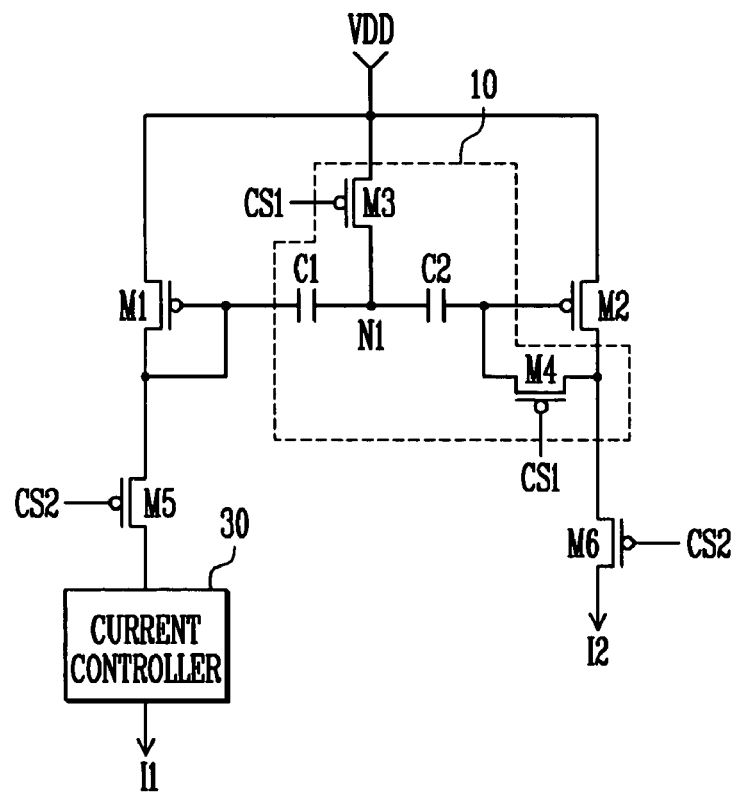
FIG. 6 illustrates a current mirror circuit according to another embodiment of the invention.

FIG. 6 illustrates a current mirror circuit constructed according to another embodiment of the invention. In FIG. 6, description of the same structure as the structure of FIG. 3 will be omitted.

Referring to FIG. 6, the current mirror circuit depicted therein further includes a current controller 30, which was not shown in FIG. 3. Thus, the structure and operation of the current mirror circuit are identical to the structure and operation of the current mirror circuit illustrated in FIG. 3 except that the current mirror circuit of FIG. 6 further includes the current controller 30.

The current controller 30 is electrically connected to the transistor M5. The current controller 30 controls the amount of current supplied from the transistor M5 to the current controller 30. When the amount of current is controlled by the current controller 30, the amount of current I2 supplied to one or more external components via the transistor M6 is also controlled. That is, the current controller 30 according to the present invention controls the current I1 that flows via the transistor M5 to control the amount of current I2 output via the transistor M6.

Figure 7:
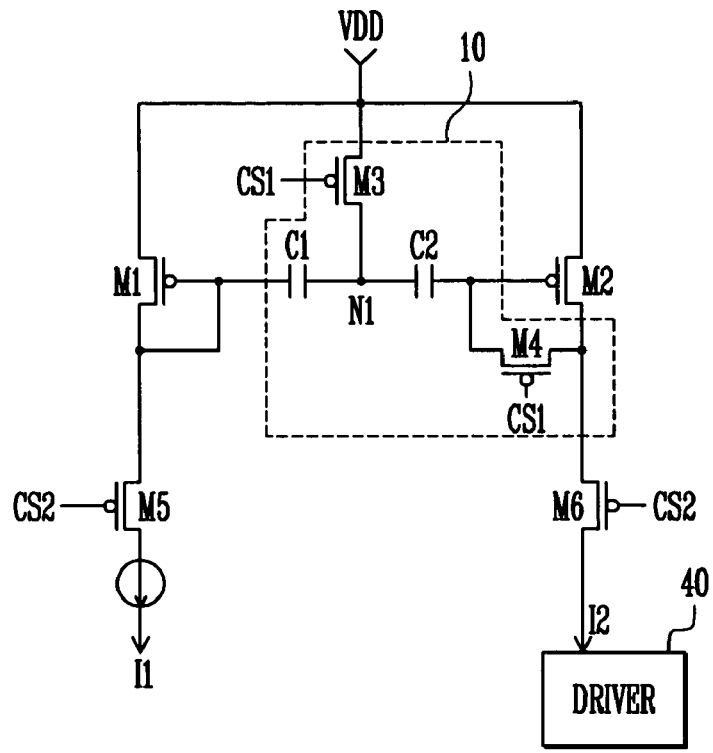
FIG. 7 illustrates a first embodiment of a driving circuit having a current mirror circuit constructed in accordance with the principles of the invention.

FIG. 7 illustrates a first embodiment of a driving circuit that includes the current mirror circuit according to the invention. Referring to FIG. 7, a driving circuit according to one embodiment of the invention includes a current mirror circuit (a bias unit) and a driver 40. The driver 40 receives the second current I2 from the current mirror circuit to be driven. The driver 40 may be an amplifier or a buffer to be driven when the second current I2 is supplied. Because the current mirror circuit supplies a desired second current I2 regardless of the threshold voltages of each of the transistors M1 and M2, the driver 40 can be stably driven.

Figure 8:
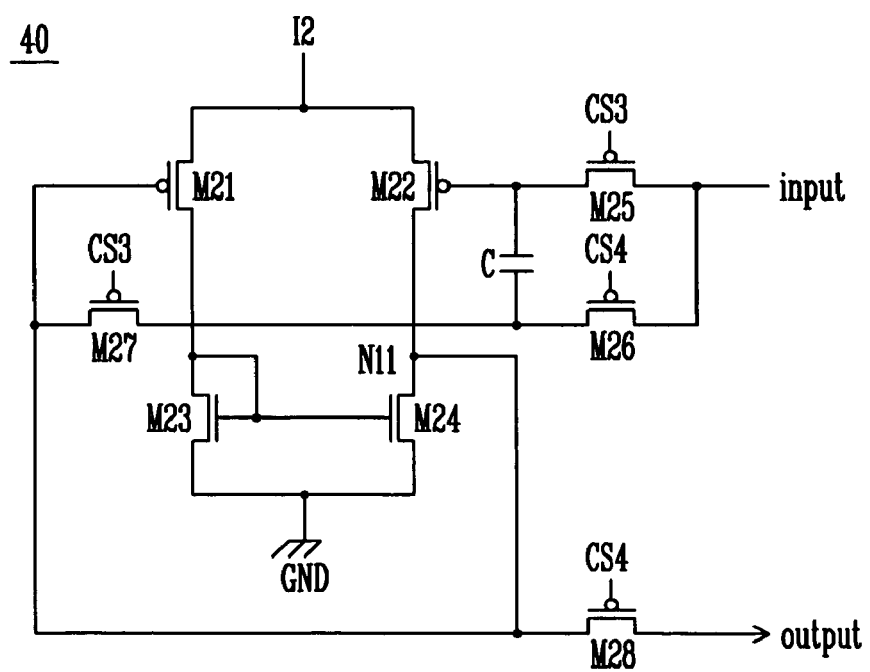
FIG. 8 is a circuit diagram illustrating an example of the driver illustrated in FIG. 7.

FIG. 8 is a circuit diagram illustrating an example of the driver illustrated in FIG. 7. Referring to FIG. 8, the driver 40 includes transistors M21 and M22 that receive the second current I2, a transistor M23 connected between the transistor M21 and a ground potential GND, and a transistor M24 connected between the transistor M22 and the ground potential GND. The $24^{th}$ transistor M24 is further connected to the transistor M23 to form (another) current mirror circuit.

In use, transistor M21 supplies part of the second current I2 to the transistor M23. Because the first terminal of the transistor M23 is electrically connected to the gate terminal of transistor M23, the voltage applied to the first terminal of the transistor M23 corresponds to the voltage supplied to the gate terminal thereof. Here, the gate terminal of the transistor M21 receives voltage from the second terminal (that is, an $11^{th}$ node N11) of the transistor M22. The transistor M22 supplies the remaining current of the second current I2 to the transistor M24, when a voltage is supplied to the gate terminal of the transistor M22.

Current flows through the transistor M23 so that the transistor M23 serves as a diode and so that the current supplied from the transistor M21 is supplied to the ground potential GND. The transistor M24 is electrically connected to the transistor M23 by a current mirror such that the transistor M24 supplies the same value of current the transistor M23 to the ground potential GND.

The driver 40 further includes a transistor M25 provided between an input terminal and the transistor M22. The transistor M25 may be controlled by a third control signal CS3. The driver 40 may also include a transistor electrically connected between the input terminal and the gate terminal of the transistor M21 to be controlled by a fourth control signal CS4. The driver 40 may further include a transistor M27 electrically connected between the transistor M26 and the gate terminal of the transistor M21. The transistor M27 may be controlled by the control signal CS3. The driver may also include a transistor M28 electrically connected between the node N11 and an output terminal. The transistor M28 may be controlled by the control signal CS4. Finally, the driver 40 may include a capacitor C electrically connected between the transistor M25 and the transistor M26.

When the control signal CS3 is supplied, the transistor M25 supplies to the gate terminal of the transistor M22 and to one side of the capacitor C, a predetermined voltage provided via the input terminal. When the control signal CS3 is supplied, the transistor M27 electrically connects the gate terminal of the transistor M21 and the other side of the capacitor C to each other. When the control signal CS4 is supplied, the transistor M26 supplies a predetermined voltage provided from the input terminal to the other side of the capacitor C. Additionally, the transistor M28 supplies the voltage applied to the node N11 to the output terminal.

Figure 9:
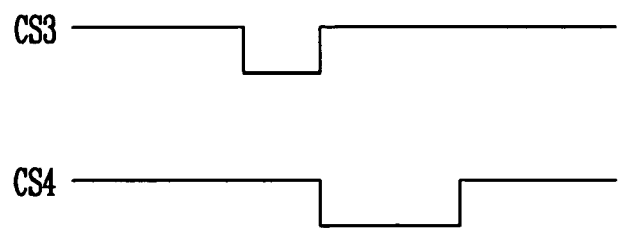
FIG. 9 illustrates control signals supplied to the driver illustrated in FIG. 8.

Operation of the first embodiment of the driving circuit of the invention will be described in detail with reference to FIGS. 8 and 9. First, the control signal CS3 is supplied from a control source. When the control signal CS3 is supplied, the transistors M25 and M27 turn on. When the transistor M25 turns on, the input voltage supplied from the input terminal flows to the gate terminal of the transistor M22. In turn, the transistor M22 supplies, to the node N11, a current that corresponds to an input voltage applied to the gate terminal of the transistor M22. At this time, a predetermined voltage is applied to the node N11 and the voltage is supplied to the gate terminal of the transistor M21. Then, the transistor M21 supplies, to the transistor M23, a current that corresponds to an input voltage supplied to the gate terminal of the transistor M21.

For example, when the voltage of the gate terminal of the transistor M22 is lower than the voltage of the gate terminal of the transistor M21, the current that flows from the transistor M21 is set to be higher than the current that flows from the transistor M22. That is, the transistor M21 can supply a current that amounts to about ⅔ of the second current I2 to the transistor M23, and the transistor M22 can supply the current that amounts to about ⅓ of the second current I2 to the transistor M24.

At this time, the transistor M23 supplies the current that amounts to about ⅔ of the second current I2 to the ground potential GND. The transistor M24, electrically connected to the transistor M23 by a current mirror circuit, also supplies the current that amounts to about ⅔ of the second current I2 to the ground potential GND. Therefore, the node N11 receives both the current that amounts to about ⅓ of the second current I2 from the transistor M22 and the current that amounts to about ⅓ of the second current I2 from the gate terminal of the transistor M21. As a result, the voltage of the node N11 increases. Actually, the voltage of the node N11 increases until the value of the current that flows from the transistor M21 equals the value of the current that flows from the transistor M22. That is, the voltage of the node N11 increases to equal the input voltage supplied to the gate terminal of the transistor M21.

On the other hand, when the transistor M27 turns on in response to the control signal CS3, the voltage of the node N11 is supplied to the other side of the capacitor C. Then, the capacitor C stores a voltage having a value that corresponds to the difference between the input voltage and the voltage applied to the node N11.

Then, the control signal CS4 is supplied. When the control signal CS4 is supplied, the transistors M26 and M28 turn on. When the transistor M26 turns on, the input voltage is supplied to the other side of the capacitor C. Then, a voltage that corresponds to the sum of the voltage stored in the capacitor C and the input voltage is supplied to the gate terminal of the transistor M22.

Then, a predetermined voltage is applied to the node N11 and the (predetermined) voltage is supplied to the gate terminal of the transistor M21 and the output terminal. By way of example, the node N11 may have a voltage equal to the input voltage, and this voltage may be supplied to the output terminal so that the driver 40 is driven as a buffer.

As described above, the driver 40 included in the driving circuit of the invention can be used in various circuits. For example, the driving circuit of the invention can be used for a flat panel display such as a liquid crystal display and a light emitting display. For example, the driving circuit of the present invention can be used for either a buffer or an amplifier that is included in a light emitting display.

Figure 10:
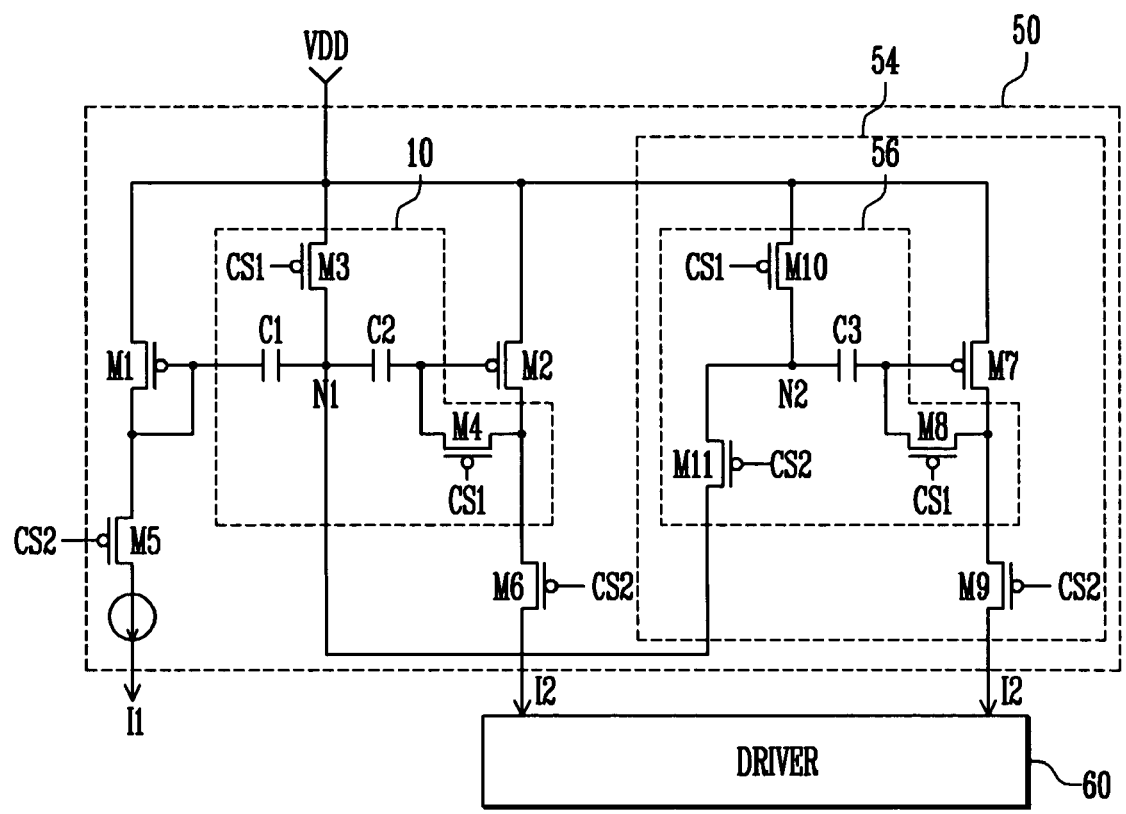
FIG. 10 illustrates a second embodiment of a driving circuit having a current mirror circuit constructed in accordance with the principles of the invention.

FIG. 10 illustrates a second embodiment of a driving circuit having the current mirror circuit of the invention. Referring to FIG. 10, the driving circuit according to the second embodiment of the invention includes a bias unit 50 and a driver 60.

The bias unit 50 may include a current mirror circuit and an output unit 54 connected to the current mirror circuit. Here, when the two second currents I2 are supplied to the driver 60, one output unit 54 is included in the bias unit 50. When three second currents I2 are supplied to the driver 60, the two output units 54 are included in the bias unit 50.

The output unit 54 includes a seventh transistor M7 connected to the transistor M1 by a current mirror circuit, a compensator 56 for compensating for the threshold voltage of the transistor M7, and a ninth transistor M9. The transistor M7 may electrically connect to the transistor M1 to form a current mirror circuit. In such a configuration, the gate terminal of the transistor M7 may electrically connect to the gate terminal of the transistor M1. Additionally, the first terminal of the transistor M7 may electrically connect to the voltage source VDD.

The transistor M9 may electrically connect between the second terminal of the transistor M7 and the driver 60. The transistor M9 turns on when the control signal CS2 is supplied and electrically connects the second terminal of the transistor M7 with the driver 60.

The compensator 56 compensates for the threshold voltage of the transistor M7, and thus includes an eighth transistor M8, a tenth transistor M10, an eleventh transistor M11 and a third capacitor C3.

The capacitor C3 may electrically connect between the gate terminal of the transistor M7 and the node N1. The capacitor C3 stores a voltage that corresponds to the threshold voltage of the transistor M7.

The transistor M8 may be electrically connected between the gate terminal and the second terminal of the transistor M7. The transistor M8 turns on when the control signal CS1 is supplied so that electric current flows through the transistor M7 and so that the transistor M7 also serves as a diode.

The transistor M10 may electrically connect between one side of the capacitor C3 and the node N1, that is, between the second node N2 and the voltage source VDD. The transistor M10 turns on when the control signal CS1 is supplied from a control source to supply voltage from the voltage source VDD to the node N2.

The transistor M11 may electrically connect between the node N1 and the node N2. The transistor M11 electrically connects the node N1 and the node N2 to each other when the control signal CS2 is supplied.

Operations of the second embodiment of the driving circuit of the invention will be described in detail with reference to FIGS. 4 and 10. First, the control signal CS1 is supplied to turn on the eighth and tenth transistors M8 and M10. When the transistor M10 turns on, the voltage of the node N2 rises to the voltage of the voltage source VDD. When the transistor M8 turns on, electric current flows through the transistor M7 so that the transistor M7 serves as diode. When electric current flows through the transistor M7 so that the transistor M7 serves as a diode, the voltage of the gate terminal of the transistor M7 has a value equal to what may be obtained by subtracting the threshold voltage $V_{th}$ of the transistor M7 from the voltage of the voltage source VDD. At this time, a voltage that corresponds to the threshold voltage $V_{th}$ of the transistor M7 is stored in the capacitor C3.

Then, the control signal CS2 is supplied to turn on the ninth and eleventh transistors M9 and M11. The first current I1 flows via the transistor M1 in the period when the control signal CS2 is supplied. When the transistor M9 turns on, it electrically connects the driver 60 and the transistor M7 to each other. When the transistor M11 turns on, it electrically connects the first and second nodes N1 and N2 to each other. Since the transistor M7 is electrically connected to the transistor M1 by a current mirror, the transistor M7 also supplies the second current I2 to the driver 60 to drive the driver 60. The value of the current I2 may correspond to the value of the current I1.

According to an embodiment of the invention, the tenth and eleventh transistors M10 and M11 included in the compensator 56 may be removed. If the transistors M10 and M11 are removed, the voltage corresponding to the threshold voltage of the transistor M7 is stably stored in the capacitor C3.

Although several embodiments of the invention have been shown and described, it will be appreciated by those skilled in the art that changes may be made to the exemplary embodiments described herein without departing from the principles and spirit of the invention, the scope of which is defined in the claims and their equivalents.

What is claimed is:

1. A current mirror circuit, comprising:
   a first transistor having a first terminal electrically connected to a voltage source and having a gate terminal and a second terminal that are electrically connected to each other;
   a second transistor having a first terminal electrically connected to the voltage source and having a gate terminal electrically connected to the gate terminal of the first transistor; and
   a compensator adapted to compensate for a threshold voltage of each of the first transistor and the second transistor, wherein the compensator is coupled with each of the first transistor and the second transistor,
   wherein the first transistor and the second transistor each serve as a diode when a first control signal is applied, and
   wherein the compensator comprises:
      a first capacitor and a second capacitor, each of which is electronically connected between the gate terminal of the first transistor and the gate terminal of the second transistor, wherein a common terminal of the first capacitor is connected to a common terminal of the second capacitor;
      a third transistor provided between the common terminals of the first and second capacitors and the voltage source and configured to be turned on when the first control signal is supplied; and
      a fourth transistor connected between the gate terminal and the second terminal of the second transistor and configured to be turned on when the first control signal is supplied.

2. The current mirror circuit of claim 1, wherein the threshold voltage of the first transistor is stored in the first capacitor and the threshold voltage of the second transistor is stored in the second capacitor when the first control signal is supplied.

3. The current mirror circuit of claim 1, further comprising:
   a fifth transistor electrically connected to the second terminal of the first transistor and configured to be turned on by a second control signal; and
   a sixth transistor electrically connected to the second terminal of the second transistor and configured to be turned on by the second control signal.

4. The current mirror circuit of claim 3, further comprising a control signal generator coupled with the fifth transistor and the sixth transistor and configured to supply the second control signal after supplying the first control signal, and separately coupled with the third transistor and the fourth transistor, wherein the control signal generator is configured to apply the second control signal to both the fifth transistor and the sixth transistor after supplying the first control signal to both the third transistor and the second transistor.

5. The current mirror circuit of claim 3, further comprising a current controller connected to the fifth transistor to control an amount of current that flows from the first transistor via the fifth transistor.

6. A current mirror circuit, comprising:
   a first transistor; a second transistor, wherein the first transistor and the second transistor are connected to form a current mirror circuit and each serves as a diode when a first control signal is applied; and
   a compensator coupled with the current mirror circuit to compensate for a threshold voltage of the first transistor and for a threshold voltage of the second transistor,
   wherein the compensator comprises:
      a first capacitor and a second capacitor, each of which is electronically connected between the gate terminal of the first transistor and the gate terminal of the second transistor, wherein a common terminal of the first capacitor is connected to a common terminal of the second capacitor;
      a third transistor provided between the common terminals of the first and second capacitors and the voltage source and configured to be turned on when the first control signal is supplied; and
      a fourth transistor connected between the gate terminal and the second terminal of the second transistor and configured to be turned on when the first control signal is supplied.

7. A driving circuit, comprising:
   a bias unit to supply a first bias current; and
   a driver coupled with the bias unit and driven when the first bias current is supplied,
   wherein the bias unit comprises;
      a first transistor having a first terminal electrically connected to a voltage source and having a gate terminal and a second terminal that are electrically connected to each other;
      a second transistor having a first terminal electrically connected to the voltage source and having a gate terminal electrically connected to the gate terminal of the first transistor; and
      a compensator adapted to compensate for a threshold voltage of the first transistor and a threshold voltage of the second transistor, wherein the compensator is coupled with each of the first transistor and the second transistor,
      wherein the first transistor and the second transistor each serve as a diode when a first control signal is applied, and
      wherein the compensator comprises:
         a first capacitor and a second capacitor, each of which is electrically connected between the gate terminal of the first transistor and the gate terminal of the second transistor, wherein a common terminal of the first capacitor is connected to a common terminal of the second capacitor;
         a third transistor electrically connected between the common terminals of the first and second capacitors and the voltage source and configured to be turned on when the first control signal is supplied; and a fourth transistor electrically connected between the gate terminal and the second terminal of the second transistor and configured to be turned on when the first control signal is supplied.

8. The driving circuit of claim 7, wherein the threshold voltage of the first transistor is stored in the first capacitor and the threshold voltage of the second transistor is stored in the second capacitor when the first control signal is supplied.

9. The driving circuit of claim 8, further comprising:
a fifth transistor electrically connected to the second terminal of the first transistor wherein the fifth transistor is configured to be turned on by a second control signal and to provide a current path so that a predetermined first current flows from the first transistor; and
a sixth transistor electrically connected between the second terminal of the second transistor and the driver wherein the sixth transistor is configured to be turned on by the second control signal and to supply to the driver a first bias current that corresponds to the first current.

10. The driving circuit of claim 9, wherein the first control signal and the second control signal are supplied sequentially.

11. The driving circuit of claim 9, wherein the bias unit further comprises an output unit for supplying a second bias current to the driver.

12. The driving circuit of claim 11, wherein the output unit comprises;
a seventh transistor electrically connected to the first transistor by a current mirror circuit;
an eighth transistor electrically connected between the second terminal and the gate terminal of the seventh transistor and configured to be turned on when the first control signal is supplied;
a third capacitor electrically connected between the gate terminal of the seventh transistor and the first capacitor; and
a ninth transistor electrically connected between the driver and the second terminal of the seventh transistor and configured to be turned on when the second control signal is supplied.

13. The driving circuit of claim 12, wherein the output unit further comprises:
a tenth transistor electrically connected between the voltage source and the third capacitor and configured to be turned on when the first control signal is supplied; and an eleventh transistor electrically connected between the third capacitor and the first capacitor and configured to be turned on when the second control signal is supplied.

14. A method of driving a current mirror circuit, the method comprising the steps of:
compensating for a threshold voltage of each of a first transistor and a second transistor that are electrically connected in the form of a current mirror circuit;
supplying a first current via the first transistor through which electric current flows so that the first transistor serves as a diode; and
supplying a second current via the second transistor such that a value of the second current equals, or approximately equals, a value of the first current,
wherein the first transistor and the second transistor each serve as a diode when a first control signal is applied, and
wherein the compensator comprises:
a first capacitor and a second capacitor, each of which is electrically connected between the gate terminal of the first transistor and the gate terminal of the second transistor, wherein a common terminal of the first capacitor is connected to a common terminal of the second capacitor;
a third transistor electrically connected between the common terminals of the first and second capacitors and the voltage source and configured to be turned on when the first control signal is supplied; and
a fourth transistor electrically connected between the gate terminal and the second terminal of the second transistor and configured to be turned on when the first control signal is supplied.

15. The method of claim 14, wherein the step of compensating for the threshold voltages comprises the steps of:
storing the threshold voltage of the first transistor in the first capacitor that is electrically connected to the gate terminal of the first transistor; and
storing the threshold voltage of the second transistor in the second capacitor that is electrically connected to the gate terminal of the second transistor.

16. The method of claim 14, further comprising the step of controlling the amount of the first current via a current controller that is electrically connected to the first transistor.

* * * * *